(12) United States Patent  
Chu

(10) Patent No.: US 8,710,703 B2  
(45) Date of Patent: Apr. 29, 2014

(54) LOW POWERED ACTIVATION ARRANGEMENT AND METHOD THEREOF

(76) Inventor: Jack Chu, Kowloon (HK)

(*) Notice: Subject to any disclaimer, the term of this patent is extended or adjusted under 35 U.S.C. 154(b) by 1264 days.

(21) Appl. No.: 12/584,763

(22) Filed: Sep. 11, 2009

(65) Prior Publication Data

US 2011/0065355 A1 Mar. 17, 2011

(51) Int. Cl.
 *H01H 47/00* (2006.01)
(52) U.S. Cl.
 USPC .......................................... 307/125; 200/511
(58) Field of Classification Search
 USPC .......................................... 307/125; 200/511
 See application file for complete search history.

(56) References Cited

U.S. PATENT DOCUMENTS 7,825,346 B2 * 11/2010 Chu ............................. 200/511

* cited by examiner

*Primary Examiner* — Robert L. Deberadinis
(74) *Attorney, Agent, or Firm* — Raymond Y. Chan; David and Raymond Patent Firm

(57) ABSTRACT

A fabric product includes a body having a skin made by interweaving a plurality of textile fabrics and a low powered activation arrangement which includes an electronic unit and one or more conductive threads extended underneath the skin of the body. The electronic unit includes a power source, an activation circuit which is a low powered activation circuit, and an operator. Each of the conductive threads has a proximal end portion electrically coupled with the activation circuit and a distal end portion which is extended to an outer surface of the skin of the body at a predetermined location thereof and is arranged in such a manner that when the distal end portion of the conductive thread is being contacted, the activation circuit is activated to actuate the operator.

21 Claims, 7 Drawing Sheets

LOW POWERED ACTIVATION ARRANGEMENT AND METHOD THEREOF

BACKGROUND OF THE PRESENT INVENTION

1. Field of Invention

The present invention relates to a low powered activation arrangement, and more particularly to an activation arrangement especially for a toy, which is able to be touched to activate an electronic device.

2. Description of Related Arts

An electronic device normally has a switch or button electrically connecting to a CPU of the electronic device for operating purpose, such as turning on or off, or selectively starting a function of the device. The switch commonly needs to be pushed, pressed, upwardly and downwardly flipped to operate the on-and-off mannered switch. For example, the conventional lever type switch is arranged to be operated by flicking the lever.

In order to relatively more convenient to activate the electronic device, another touch panel type of switch is adapted for operatively controlling the electronic device. Thus, the electronic device is able to be actuated by simply touching the touch panel. The touch panel is commonly using a conductive panel, so that when human is touching the conductive panel, the resistance of the circuit is changed by the human temperature, touching pressure, or the likes, to send out the activation signal.

No matter the traditional switches or the touch panel switches, there are still lots of drawbacks that need to be overcome, so that the electronic devices are able to be flexibly incorporated with variety purposes. One of the significant shortages is the rigidity of the switches. They tend to be bulky and/or solid in comparison of electronic devices. Therefore, those switches occupied a significant volume of the electronic device to make the electronic device relatively larger and reduce the portability thereof, so as to limit the application of the electronic device.

Another dramatic shortcoming of current switches, no matter the traditional switches or touch panel switches, is that the switches have to link to a CPU of the electronic device via a plurality of wires. In order to safely accommodate and organize those wires, a substantially rigid casing is normally provided for storing those wires. Therefore, the electronic device barely has flexible shape for more applications.

The rigid switches electrically connected to the CPU by the wires usually cause another concerning issue. The displacement between the switches and the wires reduces the stability of the performance of the electronic device. After using the electronic device a while, the connection of the switches and the CPU is loosing to affect the function of the electronic device.

Take a toy incorporated with the electronic device for instance. The toy, especially designed for kids, needs a relatively higher safety requirement and higher durability since the kids may easily throw, fall, or break down the toy. The connection between the switch and the wires for manipulating the toy by the kids normally lacks of the sturdiness, so that makes the toy tends to be easily broken. The wires distributed within or around the toy increase the risks of the kids being hurt by accidentally pulling out the wires, such as got electric shock.

For those electronic toys having a plurality of functions commonly encircled by a solid casing, such as the piano toy. The rigid casing may hit the kids and cause dangers while the kids are playing with the toy. Some toys encircling the electronic device with soft textile materials may be relatively safer. However, the wires distribution within the soft toys, such as plush dolls, limits the function of the electronic device. The switches, such as the pushing bottoms, are hard to incorporate with the theme of the toy to provide a relatively better interaction between the toy and the kids.

Furthermore, the electronic toys especially for kids are usually not washable. After being played by the kids for a while, the textile textured toys are dirtied or have a great amount of bacteria thereon due to the kid may chew the toy or put it on the ground. It will increase the possibility of the kids getting sick. The wires disposed within the receiving pocket of the toy may also bring the dangers to the kids while they are pulling the wires when the pocket of the toy is opened.

SUMMARY OF THE PRESENT INVENTION

An object of the present invention is to provide a low powered activation arrangement, which is able to be activated without any switches.

Another object of the present invention is to provide a low powered activation arrangement, which is arranged to be touched to activate the activation arrangement without disposing wires for electrically linking to an activation circuit, so as to increase the safety.

Another object of the present invention is to provide a low powered activation arrangement, wherein the conductive threads are flexible and washable textile texture.

Another object of the present invention is to provide a low power activation arrangement, which could be activated by contacting with the distal end portion of the conductive thread.

Another object of the present invention is to provide a low powered activation arrangement, wherein the conductive threads effectively reduce the energy lose during linking to the electronic unit.

Another object of the present invention is to provide a fabric product with a low powered activation arrangement, wherein the flexibility of the skin of the body is relatively increased.

Another object of the preset invention is to provide a fabric product with a low powered activation arrangement, wherein the fabric product is washable, so as to keep the fabric product clean.

Another object of the present invention is to provide a fabric product with a low powered activation arrangement, wherein the distal end portions of the conductive threads are able to form a part of the skin of the body.

Accordingly, in order to accomplish the objects of the present invention, a fabric product comprises:

a body made of a plurality of textile fabrics interweaving to form a skin of the body; and a low powered activation arrangement, which comprises:

an electronic unit comprising a casing, a power source received in the casing, an activation circuit electrically connected to the power source, and an operator being actuated when the activation circuit is activated; and one or more conductive threads fastened with the textile fabrics of the body, wherein each of the conductive threads has a proximal end extended to the activation circuit and a distal end which is extended to an outer surface of the skin of the body at a predetermined location and is arranged in such a manner that when the distal end of the conductive thread is being contacted, the activation circuit is activated to actuate the operator.

These and other objectives, features, and advantages of the present invention will become apparent from the following detailed description, the accompanying drawings, and the appended claims.

DETAILED DESCRIPTION OF THE PREFERRED EMBODIMENT

Referring to FIGS. 1 to 5 of the drawings, a fabric product according to a preferred embodiment of the present invention is illustrated, wherein the fabric product comprises a body 100 and a low powered activation arrangement.

Figure 1:
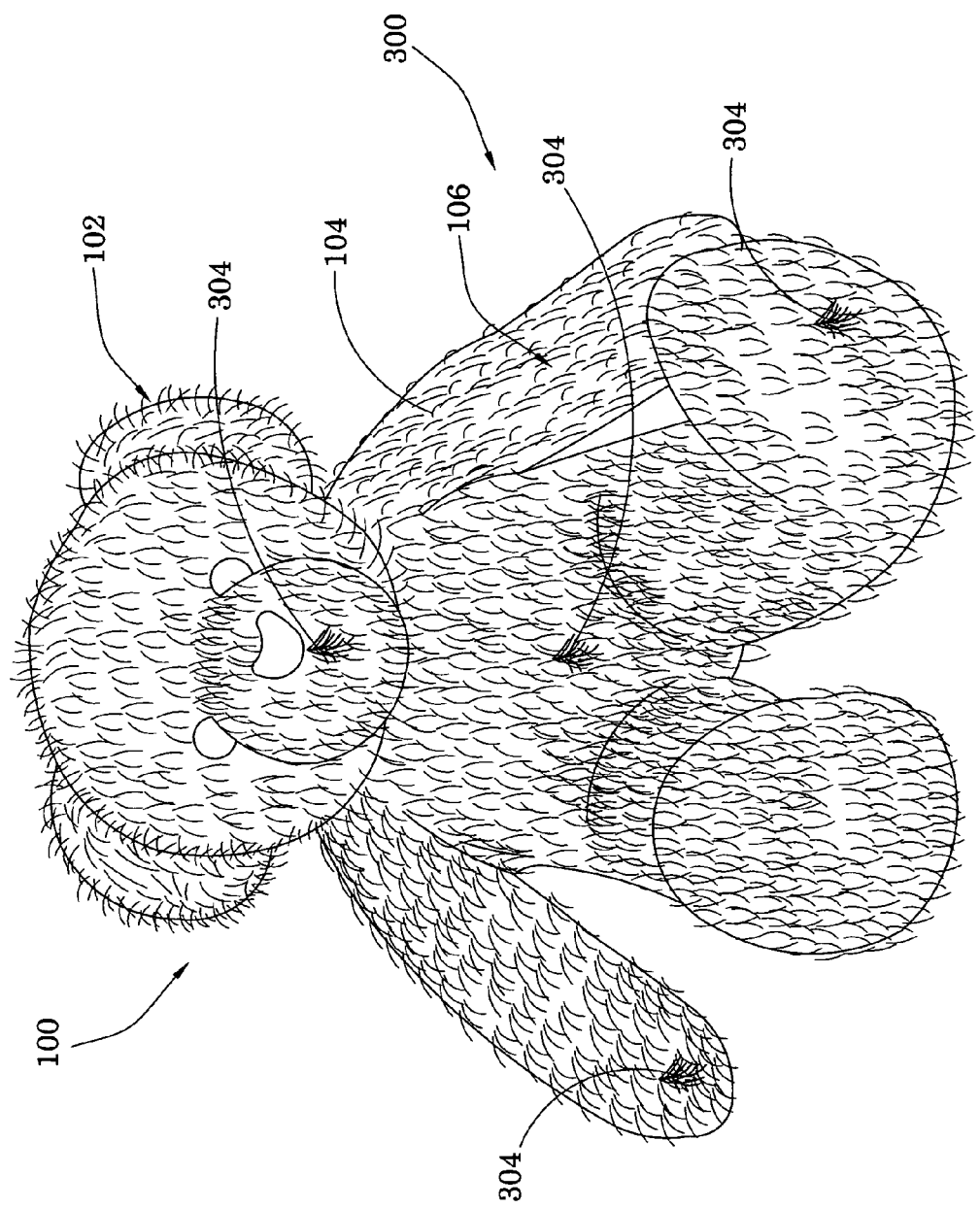
FIG. 1 is a perspective view of a fabric product with a low powered activation arrangement according to a preferred embodiment of the present invention, illustrating the distal end portions of the conductive threads on the skin of the fabric product.
Figure 2:
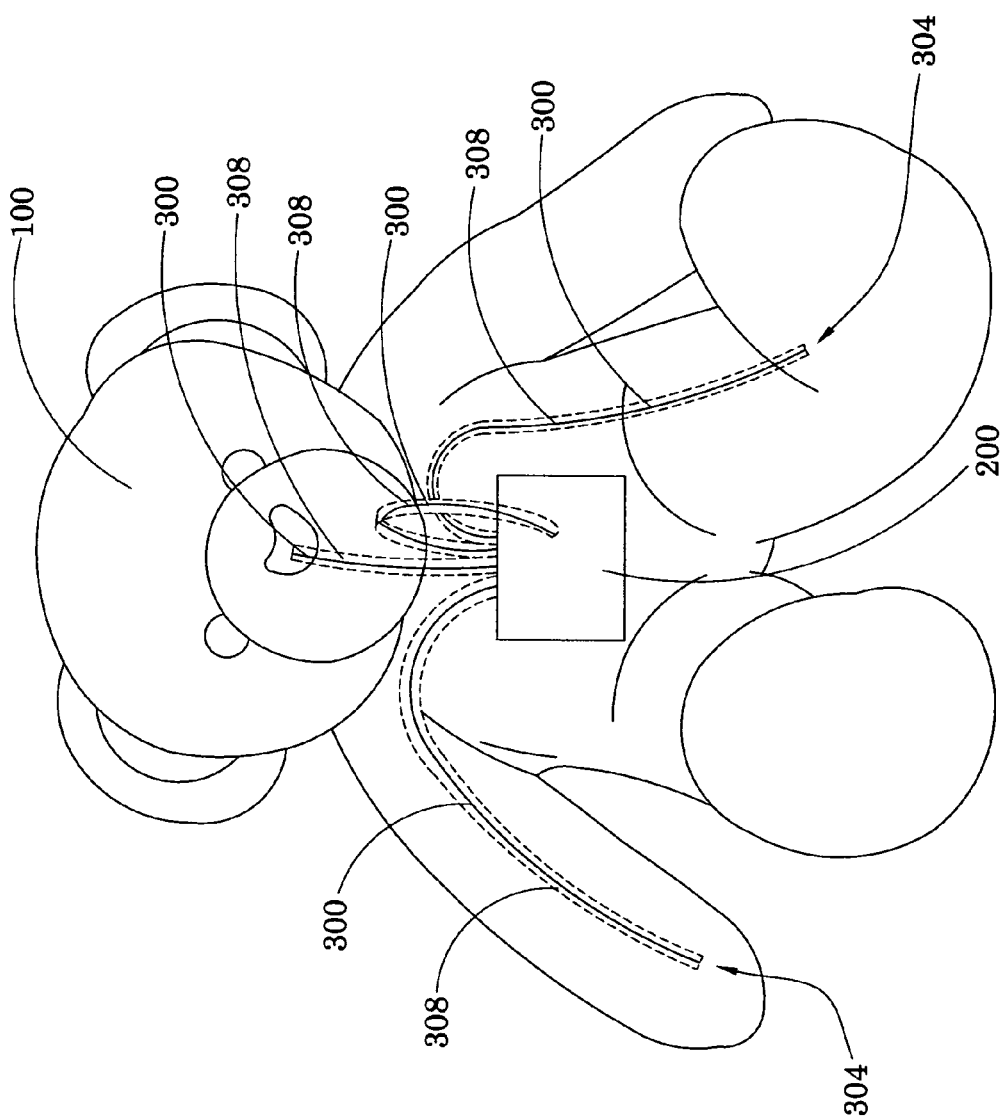
FIG. 2 is a perspective view of the fabric product according to the above preferred embodiment of the present invention, illustrating the conductive threads extending through the body of the fabric product.

The body 100 is made by textile fabrics 102, which is preferably interweaving to form a textile article, to form a skin 104 of the body 100. The means for interweaving the textile fabrics 102 may further refer to any arts for manufacturing the textile article. As shown in FIG. 1, the body 100 is embodied as a stuff animal.

The low powered activation arrangement preferably comprises an electronic unit 200 and one or more conductive threads 300 arranged to extend underneath the skin 104 of the body 100 and to electrically link to the electronic unit 200.

Figure 4:
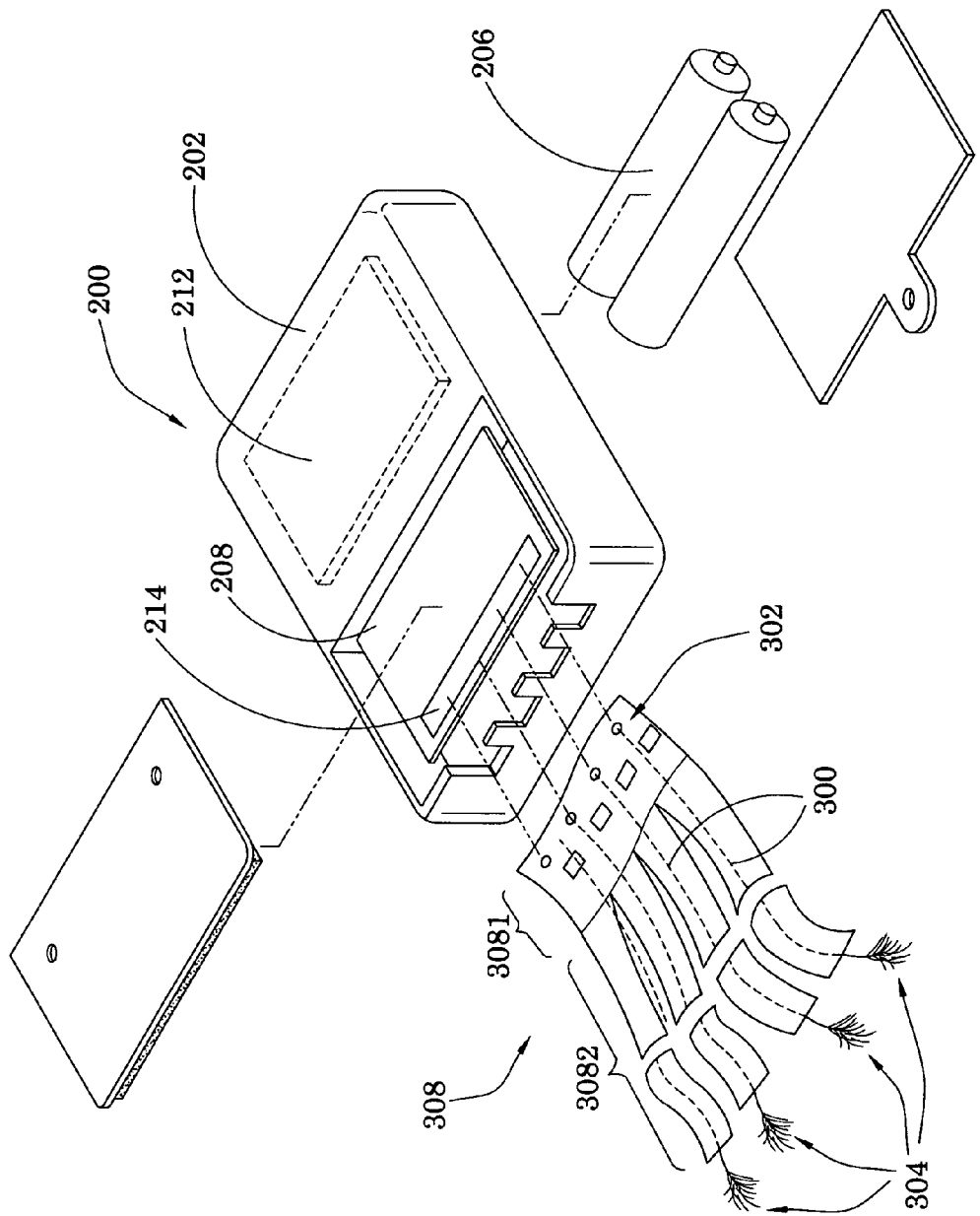
FIG. 4 is a perspective view of the conductive thread according to the above preferred embodiment of the present invention, illustrating the proximal end portions of the conductive threads electrically contacting with the activation circuit.
Figure 5:
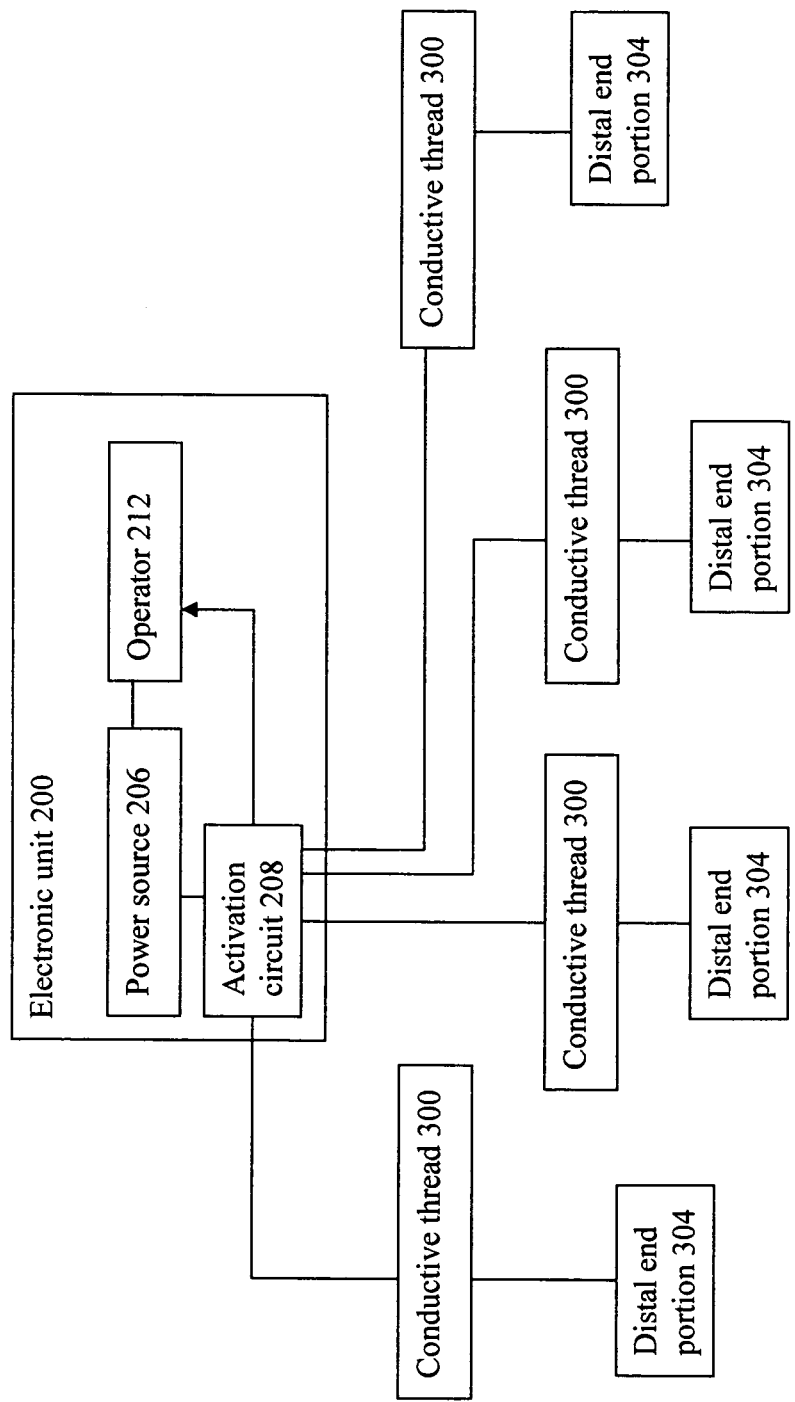
FIG. 5 is a block diagram of the low powered activation arrangement of the fabric product according to the above preferred embodiment of the present invention.

As shown in FIGS. 4 and 5, the electronic unit 200 comprises a casing 202, a power source 206 being received in the casing 202, an activation circuit 208 electrically connected to the power source 206, and an operator 212 being activated when the activation circuit 208 is activated. Accordingly, the activation circuit 208 requires a relatively low power to be activated.

The conductive threads 300 has a proximal end portion 302 extended from the electronic unit 200 of the fabric product to electrically link to the activation circuit 208, and a distal end portion 304 extended to an outer surface 106 of the skin 104 at a predetermined location, wherein when the distal end portion 304 of the conductive thread 300 is being contacted, the activation circuit 208 is activated to activate the operator 212 of the electronic unit 200 of the low powered activation arrangement.

As mentioned above, the conductive thread 300 is formed by intertwining a plurality of conductive fibers 306 to form the conductive thread 300. The winding is the ways for bundling or weaving the conductive fibers 306 to form each of the conductive threads 300, which may be achieved by many different manufacturing processes or methods, in such a manner that the thickness of the conductive thread 300 is increased to a predetermined thickness to electrically link to the electronic unit 200 to activate the operator 212 of the electronic unit 200.

According to the preferred embodiment, the conductive thread 300 is extended underneath the skin 104 of the body 100 from the electronic unit 20, wherein the distal end portion 304 of the conductive thread 300 is protruded out of the outer surface 106 of the skin 104 to form a human conductor for being contacted by human or the like. In addition, the distal end portion 304 of the conductive thread 300 is affixed at the predetermined location on the skin 104 of the body 100, wherein the proximal end portion 302 of the conductive thread 300 is arranged to be contacted to activate the activation circuit 208, so as to activate the operator 212 of the low powered activation arrangement. As one skilled in the art will readily appreciate that activating the activation circuit 208 via the human contact is only one of the examples of the contact methods. The distal end portion 304 of the conductive thread 300 may also be contacted with the distal end portion 304 of another conductive thread 300 to activate the activation circuit 208.

It is worth to mention that the directly contact at the distal end 304 of the conductive thread 300 requires no switches, such as button or touch panel, to activate the activation circuit 208, so that no complicated connection between the switch and electrical connecting lines, embodied as conductive thread 300 in the present invention, is involved, so as to simplify the overall structure and enhance the stability of the performance of the operator 212 of the electronic unit 200.

Figure 3:
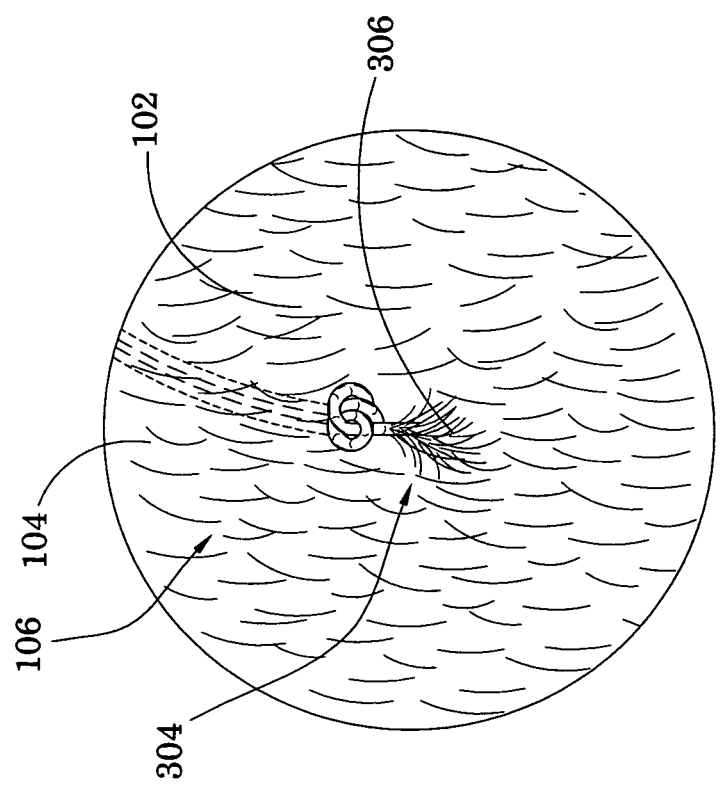
FIG. 3 is a partially perspective view of the conductive thread according to the above preferred embodiment of the present invention, illustrating the distal end portions of the conductive threads forming a part of the skin of the fabric product.

The distal end portion 304 of the conductive thread 300 is affixed on the outer surface 106 of the skin of the body 100 preferably by tightening a knot at the distal end portion 304 of the conductive thread 300, as shown in FIG. 3, so as to retain the distal end portion 304 of the conductive thread 300 at the predetermined location of the outer surface 106 of the skin of the body 100. It will be appreciated that the distal end portions 304 of the conductive threads 300 may also be affixed at the predetermined location of the skin 104 by a plurality of ways for fastening the distal end portion 304 of the conductive thread 300 at the outer surface 106 of the skin 104, such as weaving, knitting, braiding, stitching, sewing, interweaving, or spinning.

Accordingly, the distal end portions 304 of the conductive threads 300 may be bifurcated and protruded out of the outer surface 106 of the skin 104 to increase a contact area of the distal end portion 304 of the conductive thread 300, so as to be easily and conveniently contacted for activating the activation circuit 208. In the preferred embodiment, the fabric product is embodied as a plush product, such as plush doll, so that the bifurcate conductive thread 300 at the protruding distal end portion 304 may camouflage at a part of the outer surface 106 of the skin 104, while enhancing the safety and simplifying the connection for activating the activation circuit 208. In other words, the conductive fibers 306 at the distal end portion 304 of the conductive thread 300 are not intertwined to enlarge the contact area of the conductive thread 300.

It will be appreciated by one skilled in the art that the conductive threads 300 are metal threads or metallic-treated threads, such as threads with electroplating thereon or stainless steel fibers (SSF), and has a relatively high conductivity, such that using the conductive threads 300 is able to achieve the low powered arrangement to incorporate with the fabric product of the present invention. Preferably, high conductive material is electroplated on the thread to form the conductive threads 300.

In the presently preferred embodiment, a fabric layer 308 may further provided for operatively linking the proximal end portion 302 of the conductive thread 300 to a terminal of the activation circuit 208 through an opening 204 of the casing 202 of the electronic unit 200. Accordingly, the fabric layer 308 is arranged for retaining the conductive threads 300 in position, wherein the conductive thread 300 is fastened on the fabric layer 308 from the proximal end portion 302 of the conductive thread 300 towards the distal end portion 304 thereof. Therefore, each of the conductive threads 300 may be fastened on the fabric layer 308 and arranged to link each of the distal end portions 304 at the predetermined location of the outer surface 106 of the skin 104 to a related terminal end of the terminal of the activation circuit 208, so as to be touched to activate the operator 212 of the electronic unit 200. Accordingly, the fabric layer 308 forms a backing for the conductive thread 300 to guide the conductive thread 300 extending from the activation circuit 208 to the predetermined location of the skin 104 of the body 100.

More specifically, the fabric layer 308 may further has two parts, an enlarged reinforcing portion 3081 for spacedly retaining the proximal end portions 302 of the conductive threads 300 to electrically couple with the activation circuit 208, and a plurality of elongated guiding portions 3082 extended from the reinforcing portion 3081 for guiding the conductive threads 300 extending to the predetermined locations of the skin 104 of the body 100.

Accordingly the first reinforcing portion 3081 of the fabric layer 308 is a fabric article for retaining or fastening the proximal end portion 302 thereat to operatively connect to each of related terminal ends of the terminal of the activation circuit 208. The guiding portions 3082 of the fabric layer 308 are a plurality of elongated and bifurcated fabrics extended from the reinforcing portion 3081 of the fabric layer 308 towards each of distal end portions 304 at each of the predetermined locations. Therefore, each of the conductive threads 300 is affixed to each of the elongated fabrics, so as to be disposed underneath the skin 104 of the body 100, while the distal end portions 304 of the conductive threads 300 are fastened at the outer surface 106 of the skin 104 and the proximal end portions 302 of the conductive threads 300 are electrically connected to each of the terminal ends of the terminal of the activation circuit 208. Preferably, the conductive threads 300 are spacedly stitched on the fabric layer 308 to retain the conductive threads 300 in position.

As will be appreciated that the conductive threads 300 arranged for activating the activation circuit 208 to activate the operator 212 via the fabric layer 308 is one of the ways for supporting and disposing the conductive threads 300 underneath the skin 104 of the fabric product. The conductive threads 300 may also be stitched, woven, sewn, braided, interwoven, knitted, or the likes, to extend at the skin 104 of the body 100 at a position underneath the skin 104, or just directly dispose the conductive threads 300 underneath the skin 104. Furthermore, the electronic unit 200 may be encircled by the textile fabric of the skin 104 to form the fabric product in the preferred embodiment.

As shown in FIG. 4, in order to electrically couple the conductive threads 300 at the fabric layer 308 with the terminal of the activation circuit 208 of the electronic unit 200, a conductor panel 214 may be further provided at a position adjacent to the opening 204 of the casing 202 to electrically connect with the terminal of the activation circuit 208 and electrically contacting with the proximal end 302 of each of the conductive threads 300, so as to operatively link the activation circuit 208 with the conductive threads 300. As embodied in the preferred embodiment, the conductor panel 214 is contacted with the first part 3081 of the fabric layer 308 at a position that the proximal ends 302 of the conductive threads 300 are sandwiched between the conductor panel 214 and the terminal of the activation circuit 208, as shown in FIG. 4. In other words, the conductive threads 300 can be detachably coupled with the activation circuit 208 by contacting the proximal ends 302 of the conductive threads 300 with the conductor panel 214. Likewise, the conductive threads 300 can be permanently coupled with the activation circuit 208 by affixing the proximal ends 302 of the conductive threads 300 at the conductor panel 214 such as welding.

Accordingly, the distal end portions 304 protruded out of the outer surface 106 of the skin 104 softly and flexibly become parts of the outer surface 106 of the skin 104, so that there are no extra elements, such as switches or control panels are needed to be fastened on the outer surface 106 of the skin 104, so as to easily distribute the distal end portions 304 to the desired locations. The fabric product preferably adapts the flexible conductive threads 300, which is washable textile texture, to arrange the activation way for activating the operator 212, so that no wires are required for electrically linking to the electronic unit 200, so as to enhance the safety of the fabric product incorporating with electronic device.

The textile texture of the conductive threads 300 not only overly increase the flexibility of fabric product, but also enhance the washable ability of the fabric product. The washable conductive threads 300 may allow the fabric product to be washed via detachably detaching the conductive threads 300 from the electronic unit 200, so that the conductive threads 300 and the body 100 of the fabric product made from the textile fabrics 102 may be washable. Therefore, the fabric product is able to keep it clean, while enhancing the safety and simplifying the activation way to activate the operator 212 of the electronic unit 200.

When the distal end portion 304 of each of the conductive threads 300 is contacted, such as contacted via human touch as a human conductor, the activation circuit 208 is activated to activate the operator 212. Then, the operator 212 generates an effect in responsive to each of the distal end portions 304 of the conductive threads 300. For example, when the distal end portion 304 of the conductive thread 300 at a hand portion of a plush doll of bear is being touched, a corresponding signal will be sent to the operator 212 to generate a light or sound effect, such as clapping sound.

A digital storage may further provided to electrically connect to the activation circuit 208, which pre-stored one or more programs to generate different effects from the operator 212 in responsive to the contact at each of the distal end portion 304 of the conductive thread 300 protruded out of the outer surface 106 of the skin 104. For another example, when the distal end portion 304 of the conductive thread 300 at the mouth of the bear is contacted via the human touch, the activation circuit 208 electrically linked to the digital storage is activated to send out a corresponding signal to the operator 212, so that the operator 212 may generate the sound effect of a sentence, such as "I love a nice kiss from you"; when the distal end portion 304 of the conductive thread 300 at the belly of the bear, a corresponding effect of sound of "I love a nice bear hung from you" is generated from the operator 212. Therefore, the fabric product may also enhance an interaction between the human and the fabric product, such as the plush doll.

Figure 6:
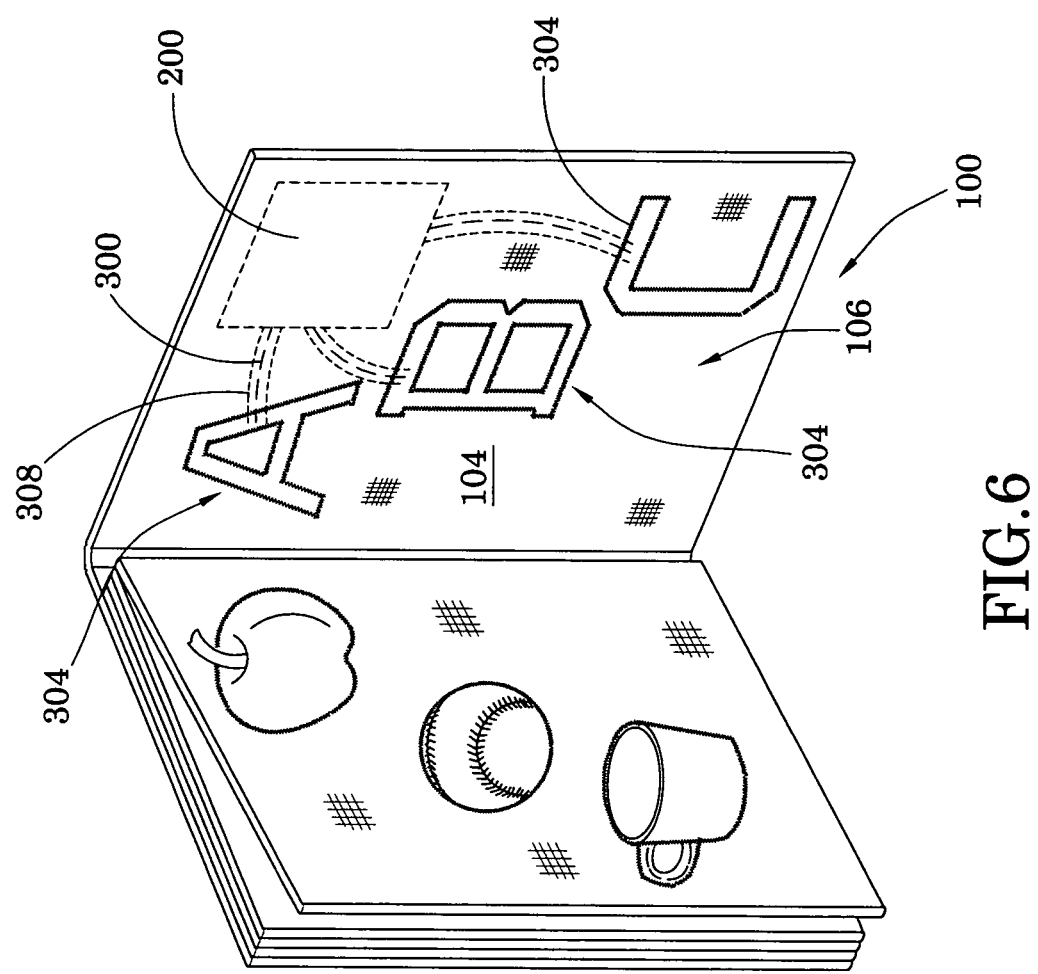
FIG. 6 illustrates a first alternative mode of the conductive thread for the fabric product according to the above preferred embodiment of the present invention.

Referring to FIG. 6 of the drawings, the fabric product according to the preferred embodiment of the present invention is shown having an alternative configuration of the body 100 and the distal end portions 304 of the conductive threads 300. In the first alternative embodiment, the distal end portions 304 are preferably affixed on the outer surface 106 of the skin 104 by knitting, stitching, sewing or the like to increase the contact surface at the distal end portions 304, so that it is relatively easier to activate the activation circuit 208 to generate the effects, such as light, sounds, voice, or the likes, from the operator 212.

The fabric product, for example, may have a book shape, and the distal end portions 304 of the conductive threads 300 may be stitched on the outer surface 106 of the skin 104 having a shape corresponding to each of the effect, such as an "A" letter is stitched on the skin 104 via the distal end portion 304 of the conductive threads 300, so that when the "A" shaped distal end portion 304 is being contacted, such as being touched by human, an "A" pronunciation is generated, so as to educate the kids while they are using the fabric book, and enhance the safety. In other words, the distal end portions 304 of the conductive threads 300 are protruded out of the skin 104 of the body 100 and are stitched on the outer surface 106 of the skin 104 to increase a contact area of the distal end portion 304 of the conductive thread 300 and to camouflage as a part of the outer surface of the skin 100. In addition, when the distal end portions 304 of the conductive threads 300 are stitched on the outer surface 106 of the skin 104, the conductive threads 300 will be retained in position.

The distal end portions 304 of the conductive threads 300 can be retained or fastened to extend to the outer surface 106 of the skin 104 by ways of stitching, knitting, sewing, or the like in variety of configurations, so that each of the distal end portions of the conductive threads 300 is able to flexibly become parts of the skin 104 of the body 100 and to form a plurality of shapes, figures, symbols, or the likes, while increased the contacting area at the distal end portion 304 of the conductive thread 300. Accordingly, the distal end portions 304 fastened or retained on the outer surface 106 of the skin 104 may also become a part of decoration of the fabric product. It is worth mentioning that the conductive threads 300 are fastened on the fabric layer 308 provides a flexibility to incorporate with the fabric book, so as to enable the fabric book to be folded without breaking the conductive threads 300.

In the present alternative of the preferred embodiment of the present invention, the electronic unit 200 may preferably received within a receiving pock of the fabric product to enclose the electronic unit 200 therein, so as to decorate the fabric. It will be appreciated that the electronic unit 200 may also be separated to electrically link to the body 100 of the fabric product via the conductive threads 300 depending on the function and design of each of the fabric product itself.

Figure 7:
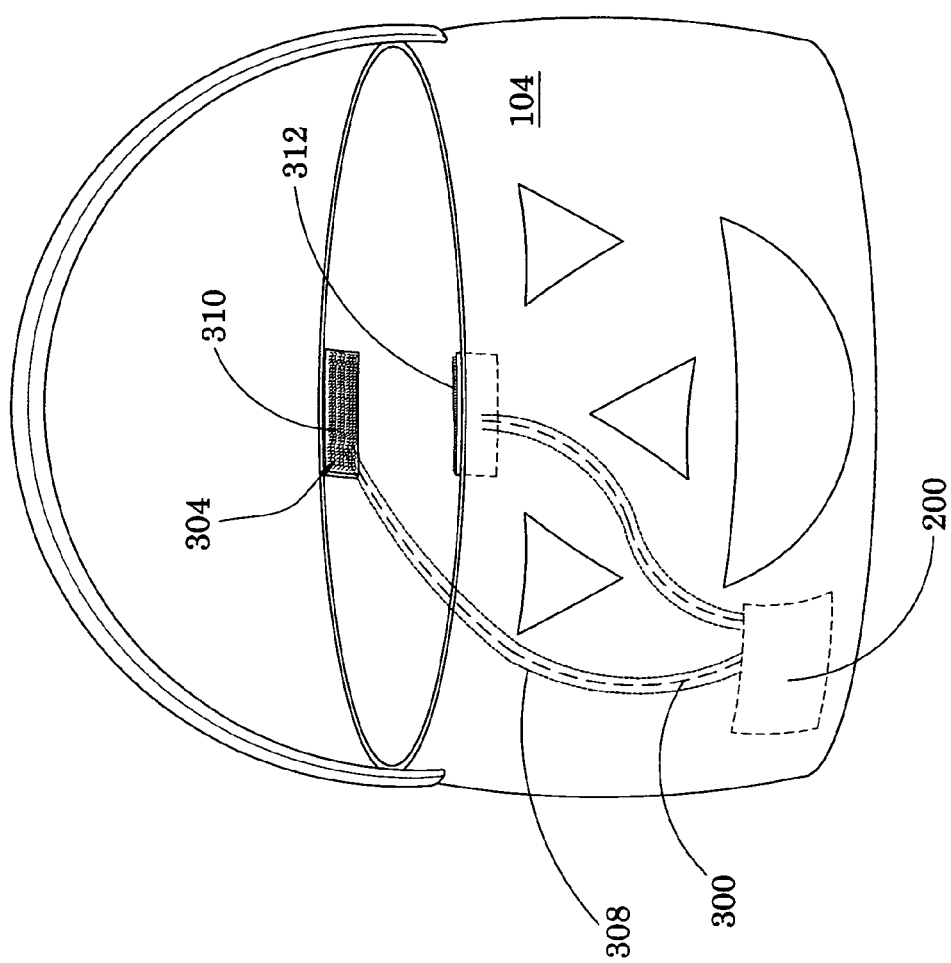
FIG. 7 illustrates a second alternative mode of the conductive thread for the fabric product according to the above preferred embodiment of the present invention.

With reference now to FIG. 7 of the drawings, the fabric product is shown having a second alternative configuration of the body 100 of the fabric product and the distal end portions 304 of the conductive threads 300. The second alternative fabric product further comprises a first fastener 310 and a second fastener 312 provided at the skin 104 of the body 100 to detachably fastening two portions of the skin 104 or two skins 104 of the fabric product. The distal end portions 304 of the conductive threads 300 are extended to the first and second fasteners 310, 312 respectively and arranged when the first and second fasteners 310, 312 are fastened with each other, the activation circuit 208 is activated via the contact of distal end portions. Accordingly, the distal end portions 304 of the conductive threads 300 can be stitched to the first and second fasteners 310, 312 respectively to retain the distal end portions 304 of the conductive threads 300 on the skin 104.

In the presently second alternative fabric product, which preferably has an opening 314 having two opening edges, such as an opening of a bag, so that the first and second fasteners 310, 312 are provided at the two opening edges. The distal end portions 304 of the conductive threads 300 are extended to the first and second fasteners 310, 312 respectively. When the first and second fasteners 310, 312 are fastened with each other to close the opening 314, the distal end portions 304 of the conductive threads 300 are contacted with each other to activate the activation circuit 208, and when the first and second fasteners 310, 312 are detached from each other to open the opening 314, the distal end portions 304 are separated from each other to deactivate the activation circuit 208.

The first and second fasteners 310, 312 may be a hook and loop type fasteners or snap buttons type fasteners for detachably detaching and attaching the first and second fasteners 310, 312, so as to activate and deactivate the activation circuit 208. Accordingly, the distal end portions 304 of the conductive threads 300 can be integrally formed as the hook and loop fasteners of the first and second fasteners 310, 312 respectively. In other words, the hooks at the first fasteners 310 are formed by the distal end portions 304 of the conductive threads 300 and the loops at the second fasteners 312 are also formed by the distal end portions 304 of the conductive threads 300 to detachably fasten with the hooks at the first fastener 310.

The effects generated from the operator 212 will be activated while the opening 314 is closed. For example, when the first and second fasteners 310, 312 are fastened with each other to close the opening 314 of a bag, a light effect is generated via the operator 212 to form an illuminating bag. It will be appreciated that the first and second fasteners 310, 312 could be any types of fasteners for detachably fastening two or more portions of the skin 104 or two or more skins 104 of the body 100.

In other words, the proximal end portions 302 of the conductive threads 300 are electrically linking to the activation circuit 208 while the respected distal end portions 304 are contacted to each other to form a closed circuit, in such a manner that the activation circuit 208 is activate to activate the operator 212, so as to activate the operator 212 of the electronic unit 200.

Accordingly, a method of manufacturing the fabric product with the low powered activation arrangement comprises the following steps.

(a) Interweaving a plurality of the textile fabrics 102 to form the skin 104 of the body 100.

(b) Fastening one or more conductive threads 300 with the textile fabrics 102 of the body 100 to extend the distal end portions 304 of the conductive threads 300 to the outer surface 106 of the skin 104 of the body 100 at the predetermined locations.

(c) Electrically connecting the proximal ends 302 of the conductive threads 300 with the activation circuit 208 of the electronic unit 200, such as an electronic device. Therefore, when the distal end portion 304 of the conductive thread 300 is being contacted, the activation circuit 208 is activated to actuate the operator 212 of the electronic unit 200.

In the presently preferred embodiment, the step (b) of the method further comprises a step of configuring the distal end portion 304 of each of the conductive threads 300 to protrude out of the outer surface 106 of the skin 104 for being contacted, such as being contacted by a human touch as a human conductor, so as to activate the activation circuit 208 to activate the operator 212.

Accordingly, the step (b) of the method may comprises a step of sewing the distal end portion 304 of each of the conductive threads 30 on the outer surface 106 of the skin 104 to form a human conductor, such that when the distal end portion 304 of the conductive thread 300 is touched by a human body, the actuation is activated to activate the operator 212.

Accordingly, the step (b) of the method may comprises a step of configuring the distal end portions 304 of the conductive threads 300 to extend to the first and second fasteners 310, 312 at opening edges of the opening 314 of the body 100 respectively. When the first and second fasteners 310, 312 are fastened with each other to close the opening 314, the distal end portions 304 of the conductive threads 300 are contacted with each other to activate the activation circuit 208. The first and second fasteners 310, 312 may be fastened at two portions of the body 100 to detachably connect two portions of the body 100.

The step (c) further comprises a step of electrically connecting the conductor panel 214 to the terminal of the activation circuit 208, and a step of electrically contacting the conductor panel 214 with the proximal end portions 302 of the conductive threads 300 to operatively link the activation circuit 208 with the conductive threads 300.

Accordingly, the step (c) may further comprises a step of spacedly fastening the proximal end portion 302 of the conductive threads 300 with the fabric layer 308 by the ways of interweaving, weaving, sewing, stitching, knitting, or braiding for retaining the proximal end portions 304 of the conductive threads 300 in position so as to electrically contact with the conductor panel 214.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A fabric product, comprising:
a body having a skin made by interweaving a plurality of textile fabrics; and
a low powered activation arrangement, which comprises:
an electronic unit which comprises a power source, an activation circuit, which is a low powered activation circuit, electrically coupled with said power source, and an operator operatively linked to said activation circuit; and
one or more conductive threads extended underneath said skin of said body, wherein each of said conductive threads has a proximal end portion electrically coupled with said activation circuit and a distal end portion which is extended to an outer surface of said skin of said body at a predetermined location thereof and is arranged in such a manner that when said distal end portion of said conductive thread is being contacted, said activation circuit is activated to actuate said operator, wherein said distal end portion of each of said conductive threads is protruded out of said skin of said body in a bifurcating manner to increase a contact area of said distal end portion of said conductive thread and to camouflage as a part of said outer surface of said skin.

2. The fabric product, as recited in claim 1, wherein each of said conductive thread comprises a plurality of conductive fibers intertwining with each other to form said conductive thread with a predetermined thickness, wherein said low powered activation arrangement further comprises a fabric layer for retaining said respective conductive thread in position, wherein said conductive thread is fastened on said fabric layer from said proximal end portion of said conductive thread towards said distal end portion thereof, such that said fabric layer forms a backing of said conductive thread to guide said conductive thread extending from said electronic unit to said predetermined location of said skin of said body, wherein said fabric layer has an enlarged reinforcing portion for spacedly retaining said proximal end portions of said conductive threads to electrically couple with said activation circuit, and a plurality of elongated guiding portions extended from said reinforcing portion for guiding said conductive threads extending to said predetermined locations of said skin of said body.

3. The fabric product, as recited in claim 2, wherein said electronic unit further comprises a conductor panel electrically coupled with a terminal of said activation circuit, wherein said proximal end portions of said conductive threads are electrically contacted with said conductor panel to electrically link said conductive threads with said activation circuit.

4. The fabric product, as recited in claim 3, wherein said conductive threads are metallic-treated threads having relatively high conductivity.

5. A fabric product, comprising:
a body having a skin made by interweaving a plurality of textile fabrics; and
a low powered activation arrangement, which comprises:
an electronic unit which comprises a power source, an activation circuit, which is a low powered activation circuit, electrically coupled with said power source, and an operator operatively linked to said activation circuit; and
one or more conductive threads extended underneath said skin of said body, wherein each of said conductive threads has a proximal end portion electrically coupled with said activation circuit and a distal end portion which is extended to an outer surface of said skin of said body at a predetermined location thereof and is arranged in such a manner that when said distal end portion of said conductive thread is being contacted, said activation circuit is activated to actuate said operator, wherein said distal end portion of each of said conductive threads is protruded out of said skin of said body and is stitched on said outer surface of said skin to increase a contact area of said distal end portion of said conductive thread and to camouflage as a part of said outer surface of said skin.

6. The fabric product, as recited in claim 5, wherein each of said conductive thread comprises a plurality of conductive fibers intertwining with each other to form said conductive thread with a predetermined thickness, wherein said low powered activation arrangement further comprises a fabric layer for retaining said respective conductive thread in position, wherein said conductive thread is fastened on said fabric layer from said proximal end portion of said conductive thread towards said distal end portion thereof, such that said fabric layer forms a backing of said conductive thread to guide said conductive thread extending from said electronic unit to said predetermined location of said skin of said body, wherein said fabric layer has an enlarged reinforcing portion for spacedly retaining said proximal end portions of said conductive threads to electrically couple with said activation circuit, and a plurality of elongated guiding portions extended from said reinforcing portion for guiding said conductive threads extending to said predetermined locations of said skin of said body.

7. The fabric product, as recited in claim 6, wherein said electronic unit further comprises a conductor panel electrically coupled with a terminal of said activation circuit, wherein said proximal end portions of said conductive threads are electrically contacted with said conductor panel to electrically link said conductive threads with said activation circuit.

8. The fabric product, as recited in claim 7, wherein said conductive threads are metallic-treated threads having relatively high conductivity.

9. A fabric product, comprising:
   a body having a skin made by interweaving a plurality of textile fabrics, wherein said body has an opening between two opening edges, and first and second fasteners provided at said opening edges respectively; and
   a low powered activation arrangement, which comprises:
   an electronic unit which comprises a power source, an activation circuit, which is a low powered activation circuit, electrically coupled with said power source, and an operator operatively linked to said activation circuit; and
   one or more conductive threads extended underneath said skin of said body, wherein each of said conductive threads has a proximal end portion electrically coupled with said activation circuit and a distal end portion which is extended to an outer surface of said skin of said body at a predetermined location thereof and is arranged in such a manner that when said distal end portion of said conductive thread is being contacted, said activation circuit is activated to actuate said operator, wherein said distal end portions of said conductive threads are extended to said first and second fasteners respectively and arranged when said first and second fasteners are fastened with each other to close said opening, said distal ends of said conductive threads are contacted with each other to activate said activation circuit, and when said first and second fasteners are detached from each other to open said opening, said distal ends of said conductive threads are separated from each other to deactivate said activation circuit.

10. The fabric product, as recited in claim 9, wherein each of said conductive thread comprises a plurality of conductive fibers intertwining with each other to form said conductive thread with a predetermined thickness, wherein said low powered activation arrangement further comprises a fabric layer for retaining said respective conductive thread in position, wherein said conductive thread is fastened on said fabric layer from said proximal end portion of said conductive thread towards said distal end portion thereof, such that said fabric layer forms a backing of said conductive thread to guide said conductive thread extending from said electronic unit to said predetermined location of said skin of said body, wherein said fabric layer has an enlarged reinforcing portion for spacedly retaining said proximal end portions of said conductive threads to electrically couple with said activation circuit, and a plurality of elongated guiding portions extended from said reinforcing portion for guiding said conductive threads extending to said predetermined locations of said skin of said body.

11. The fabric product, as recited in claim 10, wherein said electronic unit further comprises a conductor panel electrically coupled with a terminal of said activation circuit, wherein said proximal end portions of said conductive threads are electrically contacted with said conductor panel to electrically link said conductive threads with said activation circuit.

12. The fabric product, as recited in claim 11, wherein said conductive threads are metallic-treated threads having relatively high conductivity.

13. A method of activating a low powered activation arrangement of a fabric product having a skin made of textile fabric, comprising the steps of:
   (a) locating one or more conductive threads extended underneath said skin, wherein each of said conductive threads has a proximal end portion and a distal end portion;
   (b) electrically coupling said proximal end portion of each of said conductive threads with an activation circuit of said low powered activation arrangement;
   (c) guiding said distal end portion of each of said conductive threads to extend at an outer surface of said skin at a predetermined location thereof and guiding said distal end portion of each of said conductive threads being protruded out of said skin in a bifurcating manner to increase a contact area of said distal end portion of said conductive thread and to camouflage as a part of said outer surface of said skin; and
   (d) contacting said distal end portion of said respective conductive thread on said outer surface of said skin to activate said activation circuit so as to actuate an operator of said low powered activation arrangement.

14. The method, as recited in claim 13, wherein the step (a) further comprises a step of intertwining a plurality of conductive fibers with each other to form said conductive thread with a predetermined thickness; wherein the step (c) further comprises a step of fastening said conductive threads on a fabric layer for retaining said conductive threads in position, wherein said fabric layer forms a backing of said conductive threads to guide said conductive threads extending from said electronic unit to said predetermined locations of said skin; wherein said proximal end portions of said conductive threads are spacedly stitched at an enlarged reinforcing portion of said fabric layer to electrically couple with said activation circuit, while said conductive threads are stitched at a plurality of elongated guiding portions of said fabric layer for guiding said conductive threads extending to said predetermined locations of said skin; wherein the step (b) further comprises a step of electrically contacting said proximal end portions of said conductive threads with a conductor panel which is electrically coupled with a terminal of said activation circuit, so as to electrically link said conductive threads with said activation circuit.

15. The method, as recited in claim 14, wherein said conductive threads are metallic-treated threads having relatively high conductivity.

16. A method of activating a low powered activation arrangement of a fabric product having a skin made of textile fabric, comprising the steps of:
   (a) locating one or more conductive threads extended underneath said skin, wherein each of said conductive threads has a proximal end portion and a distal end portion;

(b) electrically coupling said proximal end portion of each of said conductive threads with an activation circuit of said low powered activation arrangement;

(c) guiding said distal end portion of each of said conductive threads to extend at an outer surface of said skin at a predetermined location thereof and stitching said distal end portion of each of said conductive threads on said outer surface of said skin to increase a contact area of said distal end portion of said conductive thread and to camouflage as a part of said outer surface of said skin; and (d) contacting said distal end portion of said respective conductive thread on said outer surface of said skin to activate said activation circuit so as to actuate an operator of said low powered activation arrangement.

17. The method, as recited in claim 16, wherein the step (a) further comprises a step of intertwining a plurality of conductive fibers with each other to form said conductive thread with a predetermined thickness; wherein the step (c) further comprises a step of fastening said conductive threads on a fabric layer for retaining said conductive threads in position, wherein said fabric layer forms a backing of said conductive threads to guide said conductive threads extending from said electronic unit to said predetermined locations of said skin; wherein said proximal end portions of said conductive threads are spacedly stitched at an enlarged reinforcing portion of said fabric layer to electrically couple with said activation circuit, while said conductive threads are stitched at a plurality of elongated guiding portions of said fabric layer for guiding said conductive threads extending to said predetermined locations of said skin; wherein the step (b) further comprises a step of electrically contacting said proximal end portions of said conductive threads with a conductor panel which is electrically coupled with a terminal of said activation circuit, so as to electrically link said conductive threads with said activation circuit.

18. The method, as recited in claim 17, wherein said conductive threads are metallic-treated threads having relatively high conductivity.

19. A method of activating a low powered activation arrangement of a fabric product having a skin made of textile fabric, comprising the steps of:

(a) locating one or more conductive threads extended underneath said skin, wherein each of said conductive threads has a proximal end portion and a distal end portion;

(b) electrically coupling said proximal end portion of each of said conductive threads with an activation circuit of said low powered activation arrangement;

(c) guiding said distal end portion of each of said conductive threads to extend at an outer surface of said skin at a predetermined location thereof and guiding said distal end portions of said conductive threads to first and second fasteners respectively; and (d) contacting said distal end portion of said respective conductive thread on said outer surface of said skin to activate said activation circuit so as to actuate an operator of said low powered activation arrangement;

wherein when said first and second fasteners are fastened with each other to close an opening of said fabric product, said distal ends of said conductive threads are contacted with each other to activate said activation circuit, and when said first and second fasteners are detached from each other to open said opening, said distal ends of said conductive threads are separated from each other to deactivate said activation circuit.

20. The method, as recited in claim 19, wherein the step (a) further comprises a step of intertwining a plurality of conductive fibers with each other to form said conductive thread with a predetermined thickness; wherein the step (c) further comprises a step of fastening said conductive threads on a fabric layer for retaining said conductive threads in position, wherein said fabric layer forms a backing of said conductive threads to guide said conductive threads extending from said electronic unit to said predetermined locations of said skin; wherein said proximal end portions of said conductive threads are spacedly stitched at an enlarged reinforcing portion of said fabric layer to electrically couple with said activation circuit, while said conductive threads are stitched at a plurality of elongated guiding portions of said fabric layer for guiding said conductive threads extending to said predetermined locations of said skin; wherein the step (b) further comprises a step of electrically contacting said proximal end portions of said conductive threads with a conductor panel which is electrically coupled with a terminal of said activation circuit, so as to electrically link said conductive threads with said activation circuit.

21. The method, as recited in claim 20, wherein said conductive threads are metallic-treated threads having relatively high conductivity.

\* \* \* \* \*